United States Patent
Fujiki et al.

(10) Patent No.: US 8,901,635 B2
(45) Date of Patent: Dec. 2, 2014

(54) SEMICONDUCTOR MEMORY DEVICE AND METHOD FOR MANUFACTURING THE SAME

(75) Inventors: Jun Fujiki, Kanagawa-ken (JP); Yoshiaki Fukuzumi, Kanagawa-ken (JP); Hideaki Aochi, Kanagawa-ken (JP); Tomoko Fujiwara, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 275 days.

(21) Appl. No.: 13/414,988

(22) Filed: Mar. 8, 2012

(65) Prior Publication Data
US 2013/0062681 A1    Mar. 14, 2013

(30) Foreign Application Priority Data

Sep. 12, 2011   (JP) .................................. 2011-198806
Sep. 22, 2011   (JP) .................................. 2011-207058

(51) Int. Cl.
*H01L 29/792*   (2006.01)
*H01L 27/115*   (2006.01)
*H01L 29/66*    (2006.01)

(52) U.S. Cl.
CPC ...... *H01L 29/7926* (2013.01); *H01L 27/11582* (2013.01); *H01L 29/66833* (2013.01)
USPC ............ 257/324; 257/E21.677; 257/E27.026; 257/E29.309; 438/197

(58) Field of Classification Search
None
See application file for complete search history.

(56) References Cited

U.S. PATENT DOCUMENTS

| 7,847,334 | B2 | 12/2010 | Katsumata et al. |
| 8,581,330 | B2 * | 11/2013 | Kiyotoshi ..................... 257/324 |
| 2009/0108333 | A1 * | 4/2009 | Kito et al. ..................... 257/324 |
| 2010/0213538 | A1 | 8/2010 | Fukuzumi et al. |
| 2012/0327714 | A1 * | 12/2012 | Lue .......................... 365/185.17 |

FOREIGN PATENT DOCUMENTS

| JP | 2008-171838 | 7/2008 |
| JP | 2009-111049 | 5/2009 |
| JP | 2009-135324 | 6/2009 |
| JP | 2010-80561  | 4/2010 |

* cited by examiner

*Primary Examiner* — Sonya D McCall Shepard
(74) *Attorney, Agent, or Firm* — Oblon, Spivak, McClelland, Maier & Neustadt, L.L.P.

(57) ABSTRACT

According to one embodiment, a semiconductor memory device includes a stacked body, a semiconductor pillar, an insulating film, and a charge storage film. The stacked body includes a plurality of electrode films stacked with an interlayer insulating film provided between the electrode films. The semiconductor pillar pierces the stacked body. The insulating film is provided between the semiconductor pillar and the electrode films on an outer side of the semiconductor pillar with a gap interposed. The charge storage film is provided between the insulating film and the electrode films. The semiconductor pillar includes germanium. An upper end portion of the semiconductor pillar is supported by an interconnect provided above the stacked body.

5 Claims, 10 Drawing Sheets

SEMICONDUCTOR MEMORY DEVICE AND METHOD FOR MANUFACTURING THE SAME

CROSS-REFERENCE TO RELATED APPLICATIONS

This application is based upon and claims the benefit of priority from the prior Japanese Patent Application No. 2011-198806, filed on Sep. 12, 2011, No. 2011-207058, filed on Sep. 22, 2011; the entire contents of which are incorporated herein by reference.

FIELD

Embodiments described herein relate generally to a semiconductor memory device and a method for manufacturing the same.

BACKGROUND

In the field of semiconductor memory devices, three-dimensionally stacked memory that is capable of higher bit densities and relatively unaffected by constraints due to limits of the resolution of lithography is drawing attention. Such a three-dimensionally stacked memory includes, for example, memory strings disposed two-dimensionally in a matrix configuration, where each memory string is formed by forming a semiconductor pillar in a columnar configuration, stacking a tunneling insulating layer, a charge storage layer, and a blocking insulating layer to cover the side surface of the semiconductor pillar, and providing multiple electrode films at a prescribed spacing in the stacking direction to intersect the semiconductor pillar.

Technology has been proposed to increase the reliability of such a three-dimensionally stacked memory by using a gap (an air gap) as the tunneling insulating layer.

Also, technology has been proposed to improve the characteristics of such a three-dimensionally stacked memory by using a semiconductor pillar formed in a hollow configuration using polysilicon or amorphous silicon and by forming an insulating layer on the outer wall of the semiconductor pillar using silicon oxide or silicon nitride.

However, there is a risk that the read-out speed may decrease as the number of stacks increases and the series resistance of the NAND column increases; and it is desirable to further increase the read-out speed.

DETAILED DESCRIPTION

Figure 1:
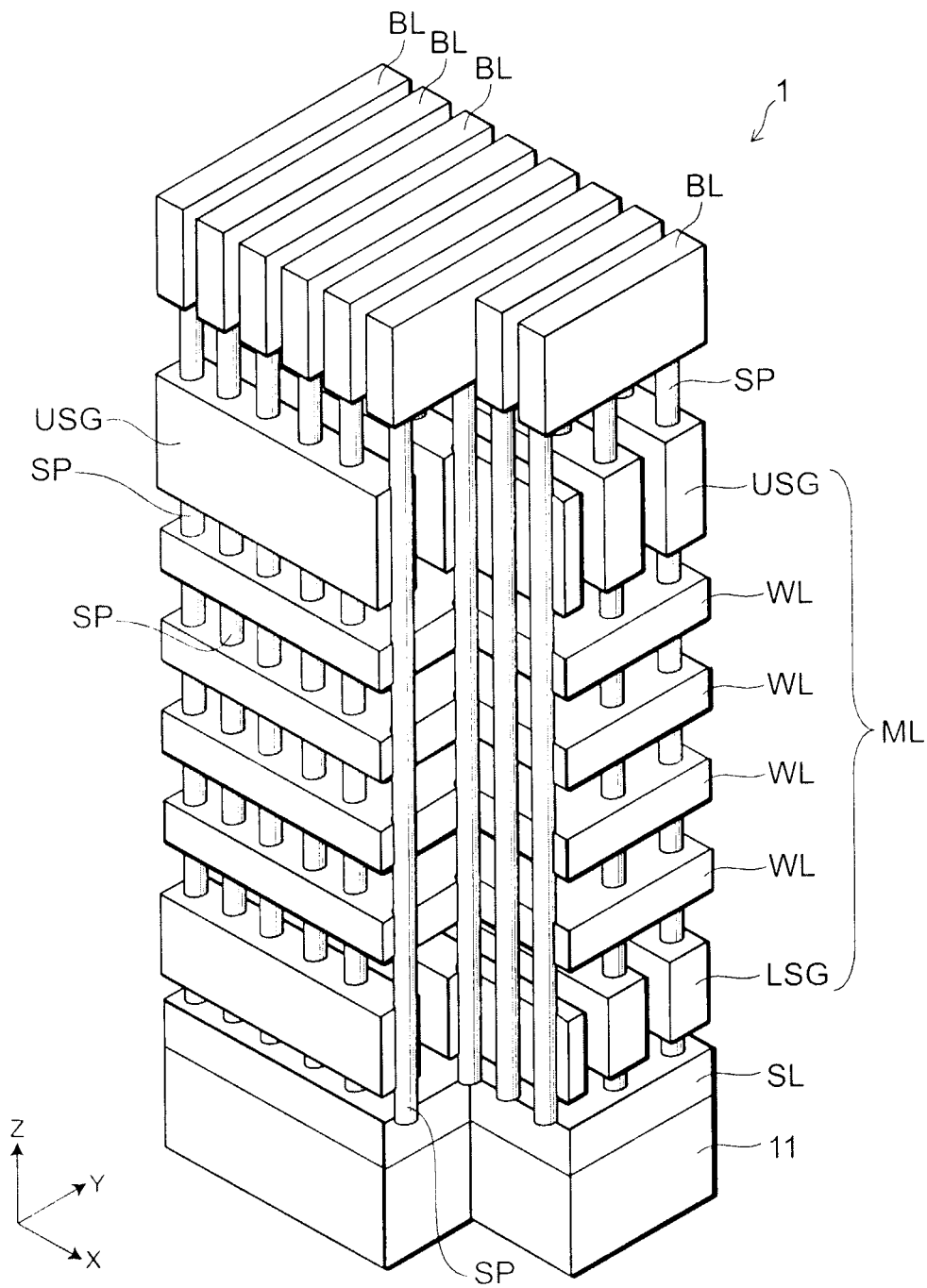
FIG. 1 is a schematic perspective cross-sectional view illustrating a semiconductor memory device according to a first embodiment.

In general, according to one embodiment, a semiconductor memory device includes a stacked body, a semiconductor pillar, an insulating film, and a charge storage film. The stacked body includes a plurality of electrode films stacked with an inter-layer insulating film provided between the electrode films. The semiconductor pillar pierces the stacked body. The insulating film is provided between the semiconductor pillar and the electrode films on an outer side of the semiconductor pillar with a gap interposed. The charge storage film is provided between the insulating film and the electrode films. The semiconductor pillar includes germanium. An upper end portion of the semiconductor pillar is supported by an interconnect provided above the stacked body.

Embodiments will now be illustrated with reference to the drawings.

Similar components in the drawings are marked with like reference numerals, and a detailed description is omitted as appropriate.

A memory region and a peripheral circuit region are provided in the semiconductor memory device; memory cells configured to store data are formed in the memory region; and a peripheral circuit configured to drive the memory cells of the memory region is formed in the peripheral circuit region. In this case, the peripheral circuit region is not illustrated because known technology can be applied to the peripheral circuit region; and the memory region is illustrated herein.

In the drawings, an X direction, a Y direction, and a Z direction are directions orthogonal to each other; the X direction and the Y direction are directions parallel to the major surface of a substrate 11; and the Z direction is a direction (a stacking direction) orthogonal to the major surface of the substrate 11.

Figure 3:
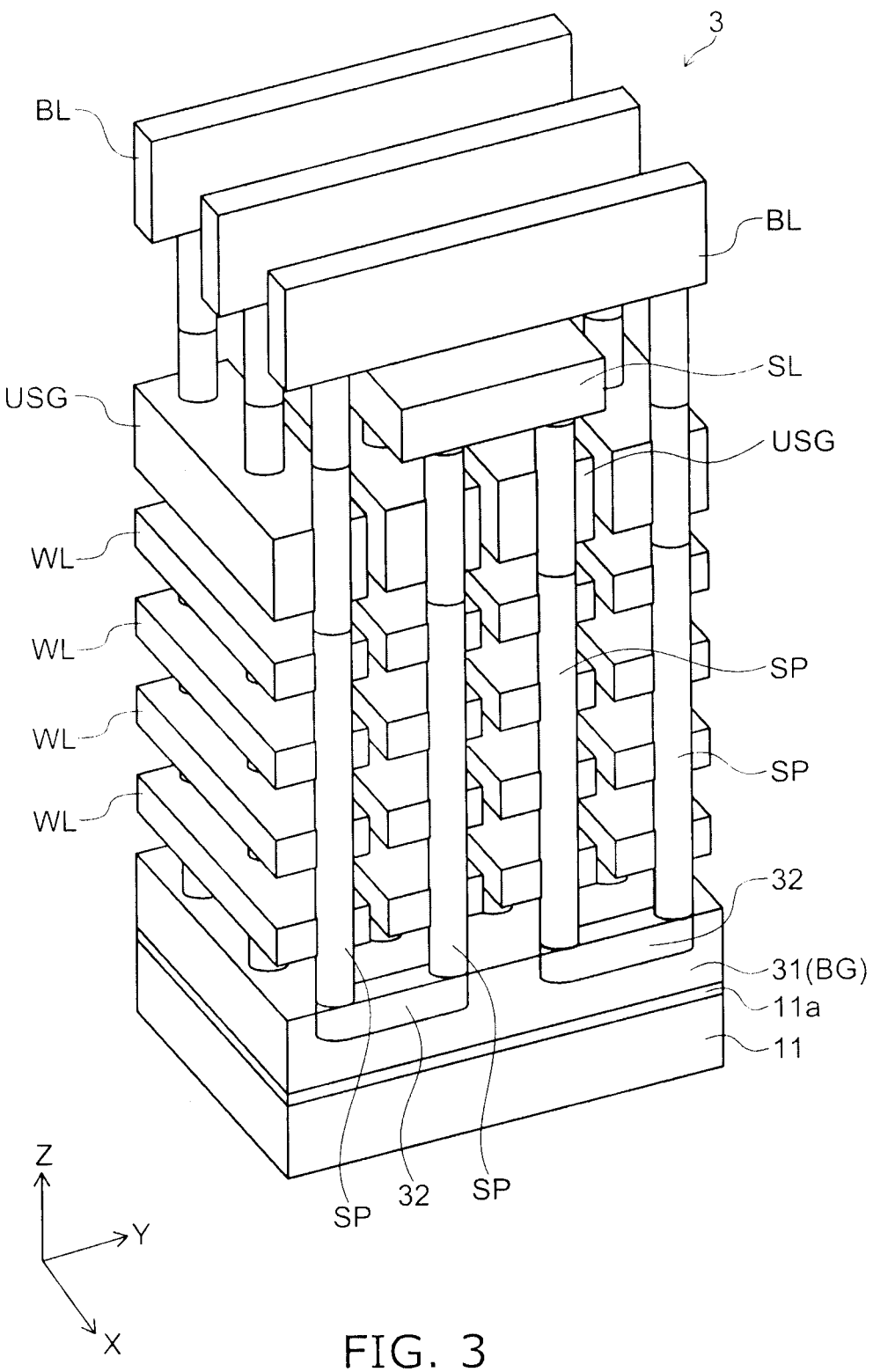
FIG. 3 is a schematic perspective cross-sectional view illustrating a semiconductor memory device according to a second embodiment.

In FIG. 1 and FIG. 3, only conductive portions are illustrated to avoid complexity, and insulating portions are not illustrated.

First Embodiment

FIG. 1 is a schematic perspective cross-sectional view illustrating a semiconductor memory device according to a first embodiment.

Figure 2:
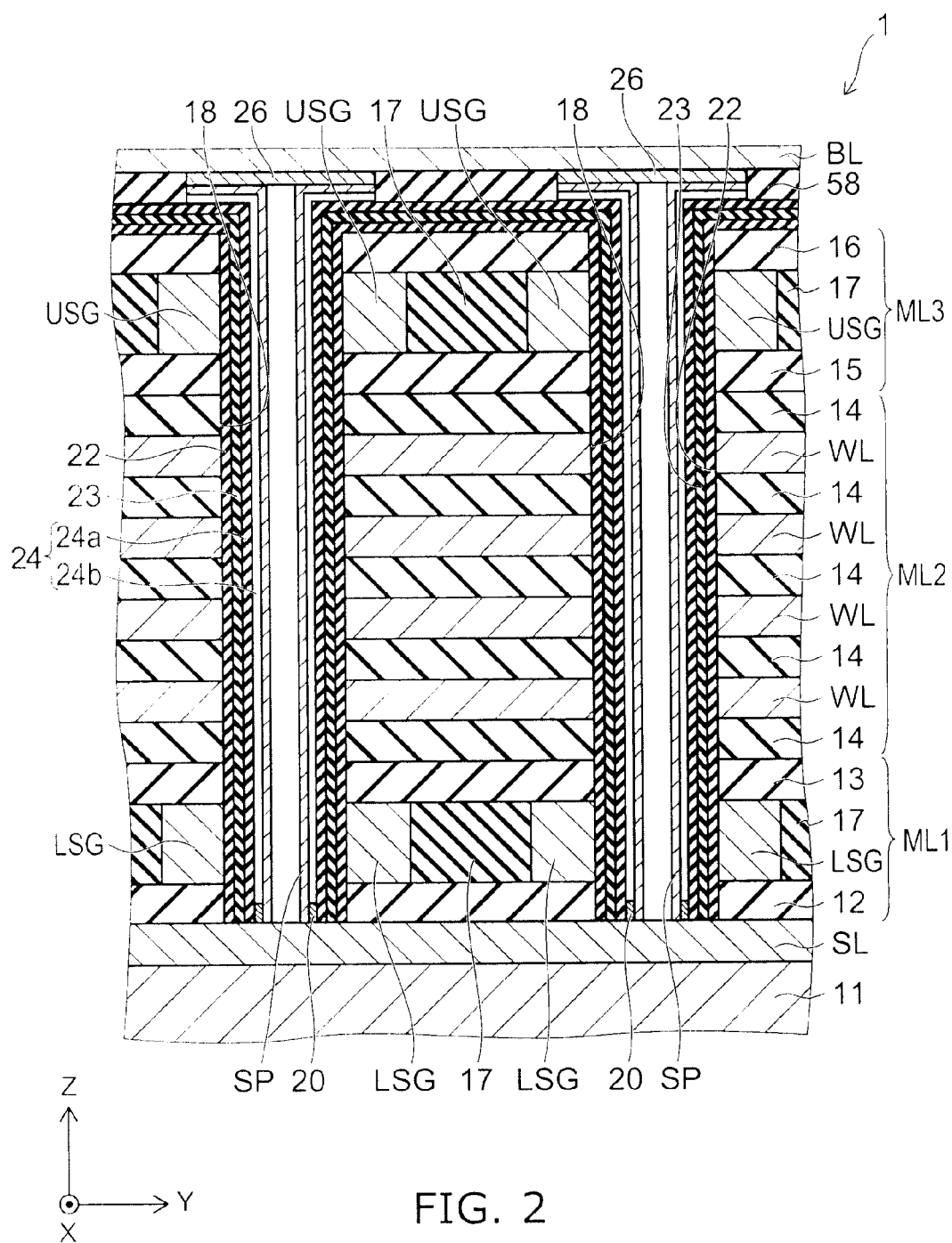
FIG. 2 is a schematic cross-sectional view illustrating a memory strings portion.

FIG. 2 is a schematic cross-sectional view illustrating a memory strings portion.

The semiconductor memory device 1 according to this embodiment is a three-dimensionally stacked flash memory. In the semiconductor memory device 1 as described below, multiple electrode films WL are stacked to be separated from each other; and a cell transistor is formed at each of the intersections between the electrode films WL and multiple semiconductor pillars SP by the semiconductor pillars SP piercing the electrode films WL. A charge storage film is provided in each of the cell transistors; and each of the cell transistors functions as a memory cell configured to store data by storing a charge in the charge storage film.

In the semiconductor memory device 1 as illustrated in FIG. 1 and FIG. 2, the substrate 11 is provided using, for example, monocrystalline silicon. A source line SL is formed in the surface layer portion of the substrate 11 by ion implantation.

A lower gate stacked body ML1 is provided on the substrate 11. An insulating film 12, lower selection gate electrodes LSG, and an insulating film 13 are stacked in this order in the lower gate stacked body ML1.

A memory stacked body ML2 is provided above the lower gate stacked body ML1. The memory stacked body ML2 includes the multiple electrode films WL provided by stacking and inter-layer insulating films 14 provided between the electrode films WL. The electrode films WL function as word lines of the semiconductor memory device 1. The inter-layer insulating films 14 function as insulating films to insulate the electrode films WL from each other. The inter-layer insulating film 14 is provided also on the electrode film WL of the uppermost layer. Although four layers of the electrode films WL are provided in the example illustrated in FIG. 1, the number of layers of the electrode films WL is not limited thereto.

An upper gate stacked body ML3 is provided above the memory stacked body ML2. An insulating film 15, upper selection gate electrodes USG, and an insulating film 16 are stacked in this order in the upper gate stacked body ML3.

One conductive film is divided in the Y direction to form the upper selection gate electrodes USG; one conductive film is divided in the Y direction to form the lower selection gate electrodes LSG; and the upper selection gate electrodes USG and the lower selection gate electrodes LSG are multiple conductive members having interconnect configurations extending in the X direction. An insulating film 17 is filled around the upper selection gate electrodes USG and the lower selection gate electrodes LSG. Conversely, the electrode film WL is divided into erasing block units and is one conductive film parallel to the XY plane inside the erasing block. Similarly to the upper selection gate electrodes USG and the lower selection gate electrodes LSG, the electrode films WL also may be divided in the Y direction. The lower selection gate electrodes LSG, the electrode films WL, and the upper selection gate electrodes USG are formed of a conductive material, e.g., amorphous silicon or polysilicon provided with a conductivity by introducing an impurity, etc. The insulating films 12 to 17 are formed of an insulating material, e.g., silicon oxide. Films that are necessary for the manufacturing processes such as, for example, stopper films made of silicon nitride and the like may be provided at any position between the films.

Multiple through-holes 18 extending in the stacking direction (the Z direction) are made in the lower gate stacked body ML1, the memory stacked body ML2, and the upper gate stacked body ML3 (generally referred to hereinbelow as the stacked body ML). Each of the through-holes 18 pierces the entire stacked body ML. The semiconductor pillar SP is formed in the interior of each of the through-holes 18. Therefore, the semiconductor pillars SP pierce the stacked body ML.

The semiconductor pillars SP have hollow columnar configurations (tubular configurations). For example, the semiconductor pillars SP have cylindrical configurations.

Here, in the case where the semiconductor pillars SP are formed using silicon such as polysilicon, etc., there is a risk that problems may occur in which the read-out speed may decrease when the number of stacks of the memory stacked body ML2 increases and the series resistance of the NAND column increases. This is caused by low mobility of the carriers of the silicon channel. Although germanium (Ge) may be used as the semiconductor material in such a case to provide a high mobility not less than that of silicon, a new problem arises in which many defects that cause hole generation occur inside the film of the germanium when the crystallization is performed after the formation of the germanium; and the desired threshold can no longer be obtained.

In this embodiment, the semiconductor pillar SP is formed using germanium. When forming the semiconductor pillar SP, substitution heat treatment is performed on a germanium film 25 that uses germanium (corresponding to an example of the first film) and an aluminum film 27 that uses aluminum (corresponding to an example of the second film). By performing such substitution heat treatment, monocrystallinization can be realized because the germanium can be caused to grow in the axis direction of the through-hole 18. Therefore, the semiconductor pillar SP can be formed to increase the mobility of the carriers, obtain the desired threshold with few defects, and realize low fluctuation of the characteristics. Details relating to the formation of the semiconductor pillar SP by performing the substitution heat treatment are described below.

The semiconductor pillar SP is provided over the entire stacking-direction length of the stacked body ML; and the lower end portion of the semiconductor pillar SP is connected to the source line SL of the substrate 11. The upper end portion of the semiconductor pillar SP is connected to a bit line BL via a plug conductive layer 26.

The plug conductive layer 26 may be formed using, for example, silicon or germanium provided with a conductivity by introducing an impurity and the like.

A support portion 20 is formed on the lower end side of the semiconductor pillar SP. The support portion 20 maintains the distance between an insulating film 24a and the semiconductor pillar SP. The upper end of the support portion 20 is formed to be lower than the lower end of the lower selection gate electrodes LSG. The support portion 20 may be formed using aluminum. Details relating to the formation of the support portion 20 are described below.

In this embodiment, the upper end portion of the semiconductor pillar SP is connected to the bit line BL via the plug conductive layer 26. In other words, the upper end portion of the semiconductor pillar SP is supported by the bit line BL which is an interconnect provided above the stacked body ML.

The lower end side of the semiconductor pillar SP is supported by the support portion 20.

Therefore, suppression of the fluctuation of the characteristics, stabilization of the characteristics, and the like can be realized because the width dimension of a gap 24b (the dimension between the semiconductor pillar SP and the insulating film 24a in the XY plane) can be maintained within a prescribed range.

A blocking insulating film 22, a charge storage film 23, and the insulating film 24a are stacked in this order on the interior wall surface of the through-hole 18.

The insulating film 24a is provided between the semiconductor pillar SP and the electrode films WL on the outer side of the semiconductor pillar SP with the gap 24b interposed. In such a case, the insulating film 24a and the gap 24b function as a tunneling insulating film 24. Therefore, the tunneling insulating film 24 can be provided with a low dielectric constant and few defects.

The blocking insulating film 22 is a film that substantially does not allow current to flow even in the case where a voltage is applied within the range of the drive voltage of the semiconductor memory device 1. The blocking insulating film 22 may be formed using a material having a dielectric constant higher than the dielectric constant of the material of the charge storage film 23. The blocking insulating film 22 may be formed using, for example, aluminum oxide.

The charge storage film 23 is a film that has the ability to maintain a charge and may be, for example, a film including trap sites of electrons. The charge storage film 23 may be formed using, for example, silicon nitride.

Although the insulating film 24a normally is insulative, the insulating film 24a may be a film that allows a tunneling current to flow when a prescribed voltage within the range of the drive voltage of the semiconductor memory device 1 is applied. The insulating film 24a may be formed using, for example, a single-layer silicon oxide film, an ONO film (the oxide-nitride-oxide film), and the like.

The blocking insulating film 22, the charge storage film 23, and the insulating film 24a are provided also between the semiconductor pillar SP and the upper selection gate electrode USG to form an upper gate insulating film. Thereby, in the upper gate stacked body ML3, an upper selection transistor is formed in which the semiconductor pillar SP is a body region having a channel region, the upper gate insulating film is a gate insulating film, and the upper selection gate electrode USG is a gate electrode.

The blocking insulating film 22, the charge storage film 23, and the insulating film 24a are provided also between the semiconductor pillar SP and the lower selection gate electrode LSG to form a lower gate insulating film. Thereby, in the lower gate stacked body ML1, a lower selection transistor is formed in which the semiconductor pillar SP is a body region having a channel region, the lower gate insulating film is a gate insulating film, and the lower selection gate electrode LSG is a gate electrode.

The multiple bit lines BL extending in the Y direction are provided above the upper gate stacked body ML3. The bit lines BL are formed using a metal such as tungsten, etc. The bit lines BL are disposed to pass through the regions directly above the columns of the semiconductor pillars SP arranged along the Y direction. The bit lines BL are connected to the upper end portions of the semiconductor pillars SP via the plug conductive layers 26. Thereby, the semiconductor pillars SP are connected between the bit lines BL and the source line SL.

According to this embodiment, the semiconductor pillar SP is formed using germanium. Substitution heat treatment is performed on the germanium and the aluminum when forming the semiconductor pillar SP. Therefore, the semiconductor memory device 1 can be provided to increase the mobility of the carriers, obtain the desired threshold with few defects, and suppress the fluctuation of the characteristics.

The insulating film 24a and the gap 24b function as the tunneling insulating film 24. Therefore, the semiconductor memory device 1 can include a tunneling insulating film 24 having a low dielectric constant and few defects.

In such a case, the upper end portion of the semiconductor pillar SP is supported by the bit line BL via the plug conductive layer 26. The lower end side of the semiconductor pillar SP is supported by the support portion 20. Therefore, suppression of the fluctuation of the characteristics, stabilization of the characteristics, and the like can be realized because the width dimension of the gap 24b can be maintained within a prescribed range.

Second Embodiment

FIG. 3 is a schematic perspective cross-sectional view illustrating a semiconductor memory device according to a second embodiment.

Figure 4:
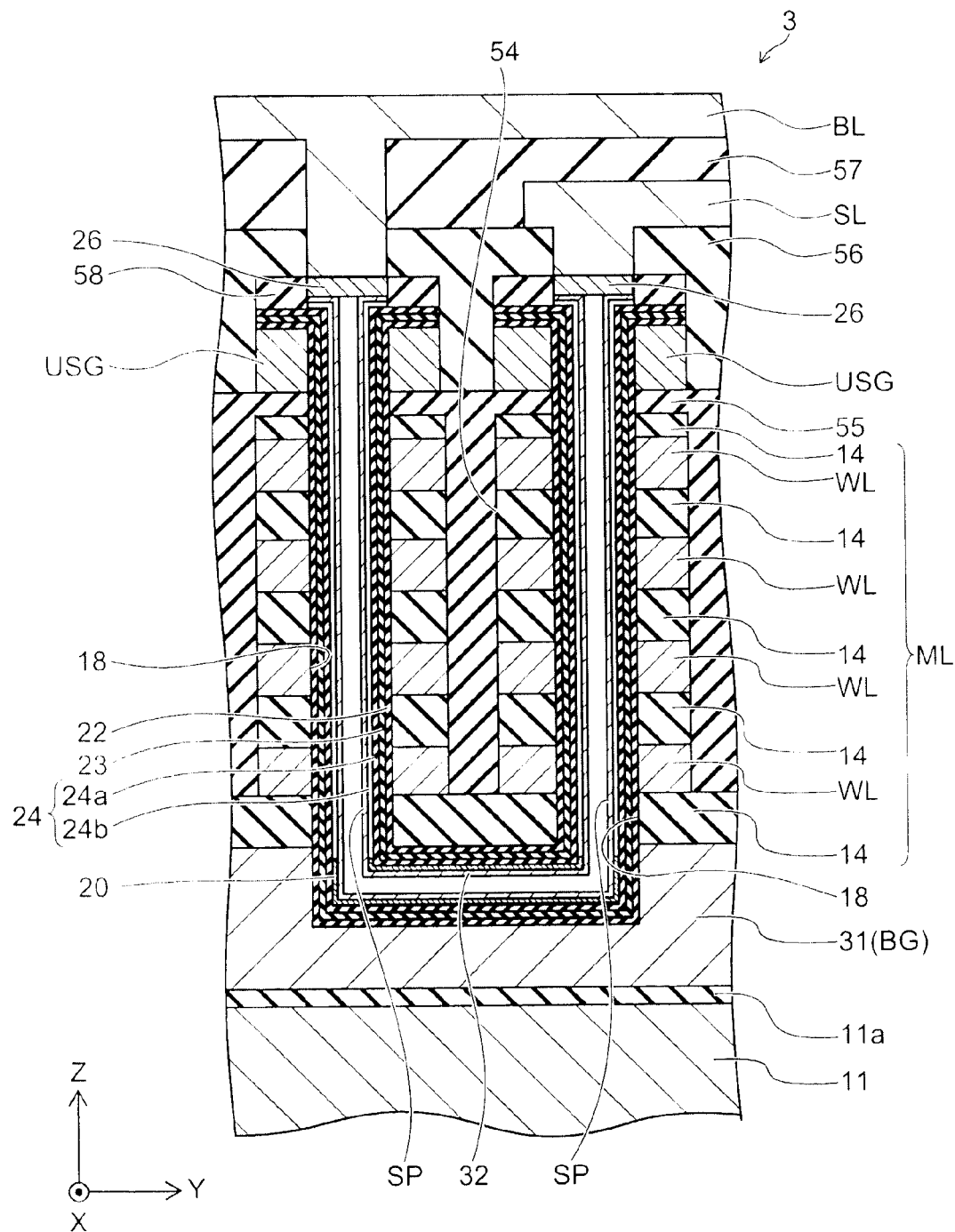
FIG. 4 is a schematic cross-sectional view illustrating a memory strings portion.

FIG. 4 is a schematic cross-sectional view illustrating a memory strings portion.

The semiconductor memory device 3 according to this embodiment also is a three-dimensionally stacked flash memory.

However, the source line is not formed in the upper layer portion of the substrate 11; and a back gate electrode 31 is formed instead of the source line. An insulating film 11a is formed in the upper layer portion of the substrate 11; and the back gate electrode 31 is formed on the insulating film 11a using, for example, a polysilicon film doped with an impurity and the like.

In the semiconductor memory device 3, the lower gate stacked body ML1 is not provided; and a connection member 32 is provided between the substrate 11 and the memory stacked body ML2. The connection member 32 is a conductive member having a rod configuration extending in the Y direction, electrically connects the lower end portions of a pair of semiconductor pillars SP adjacent to each other in the Y direction, and is formed integrally with the semiconductor pillars SP.

In the semiconductor memory device 3, the electrode films WL are divided by trenches 54 for each of the upper selection gate electrodes USG; and the electrode films WL in the region directly under one of the upper selection gate electrodes USG is arranged in multiple levels. In other words, the electrode films WL are arranged in a matrix configuration in the YZ plane and are separated from each other. Thereby, the portions of the electrode films WL pierced by one of a pair of semiconductor pillars SP connected to one connection member 32 are separated from the portions of the electrode films WL pierced by the other of the pair of semiconductor pillars SR This pair of semiconductor pillars SP pierces mutually different upper selection gate electrodes USG.

In the semiconductor memory device 3, the source line SL is provided between the upper selection gate electrodes USG and the bit lines BL. The source line SL extends in the X direction, i.e., a direction orthogonal to the bit lines BL. The width of the source line SL is wider than the widths of the upper selection gate electrode USG and the electrode film WL; the source line SL is disposed over the region directly above two columns of the semiconductor pillars SP arranged in the Y direction; and the source line SL is connected to these two columns of the semiconductor pillars SP. One of the pair of semiconductor pillars SP connected to the connection member 32 is connected to the source line SL; and the other is connected to the bit line BL. Insulating films 55 to 58 are provided between the memory stacked body ML2, the source lines SL, the bit lines BL, and the like.

The support portion 20 is formed on the lower end side of the semiconductor pillar SP. The support portion 20 maintains the distance between the insulating film 24a and the semiconductor pillar SP. The upper end of the support portion 20 is formed to be lower than the lower end of the electrode film WL of the lowermost layer. The support portion 20 may be formed using aluminum.

In this embodiment as well, the semiconductor pillar SP is formed using germanium. Substitution heat treatment is performed on the germanium and the aluminum when forming the semiconductor pillar SP. Therefore, the semiconductor memory device 3 can be provided to increase the mobility of the carriers, obtain the desired threshold with few defects, and suppress the fluctuation of the characteristics.

The insulating film 24a and the gap 24b function as the tunneling insulating film 24. Therefore, the semiconductor memory device 3 can include a tunneling insulating film 24 having a low dielectric constant and few defects.

The upper end portion of the semiconductor pillar SP is supported by the bit line BL or the source line SL which are interconnects provided above the memory stacked body ML2. The lower end side of the semiconductor pillar SP is supported by the support portion 20. Therefore, suppression of the fluctuation of the characteristics, stabilization of the characteristics, and the like can be realized because the width dimension of the gap 24b can be maintained within a prescribed range.

Third Embodiment

A method for manufacturing the semiconductor memory device 1 will now be illustrated.

In the description recited below, components similar to the components illustrated in FIG. 1 and FIG. 2 are described using like reference numerals. Therefore, the positional relationships and the like of the components refer to FIG. 1 and FIG. 2.

First, element-separating films (not illustrated) are formed at the desired positions in the upper layer portion of the substrate 11. Then, the source line SL is formed by introducing an impurity into the memory region. The source line SL may include a diffusion layer of an interconnect structure that is electrically divided by the element-separating structures or may include metal interconnects filled into the substrate 11. The source line SL may have an interconnect structure extending in the same direction as the bit lines BL with the same arrangement period as the bit lines BL. On the other hand, in the peripheral circuit region (not illustrated), a P well, an N well, and the like are formed; and the source/drains of the transistors included in the driver circuits are formed. Then, the gates of these transistors are formed.

Then, the insulating film 12 is formed by depositing an insulating material on the substrate 11 in the memory region and by planarizing. Continuing, the lower selection gate LSG is formed by depositing, for example, amorphous silicon on the insulating film 12. Then, the insulating film 13 is formed on the lower selection gate LSG. Thereby, the lower gate stacked body ML1 made of the insulating film, the lower selection gate, and the insulating film is formed.

Continuing, the inter-layer insulating film 14 is formed by depositing an insulating material such as, for example, silicon oxide, etc., on the lower gate stacked body ML1. Then, the electrode film WL is formed on the inter-layer insulating film 14. Thereafter, the inter-layer insulating films 14 and the electrode films WL are stacked alternately. In one example, four of the inter-layer insulating films 14 and four of the electrode films WL are formed. Thereby, the memory stacked body ML2 is formed.

Then, the insulating film 15 made of, for example, silicon oxide is formed on the memory stacked body ML2; the upper selection gate USG is formed by depositing, for example, amorphous silicon; and the insulating film 16 made of, for example, silicon oxide is formed. Thereby, the upper gate stacked body ML3 including the upper selection gate USG is formed.

Continuing, the through-hole 18 is made to pierce the upper gate stacked body ML3, the memory stacked body ML2, and the lower gate stacked body ML1 in the stacking direction to reach the substrate 11 by photolithography and RIE (Reactive Ion Etching). At this time, multiple through-holes 18 arranged in a matrix configuration are made simultaneously.

Then, the blocking insulating film 22, the charge storage film 23, the tunneling insulating film 24, the semiconductor pillar SP, and the support portion 20 are formed.

FIGS. 5A to 5D are schematic cross-sectional views of processes, illustrating the formation of the blocking insulating film 22, the charge storage film 23, the tunneling insulating film 24, the semiconductor pillar SP, and the support portion 20.

To avoid complexity in FIGS. 5A to 5D, only one side from a center line 18a of the through-hole 18 is illustrated.

Figure 5A:
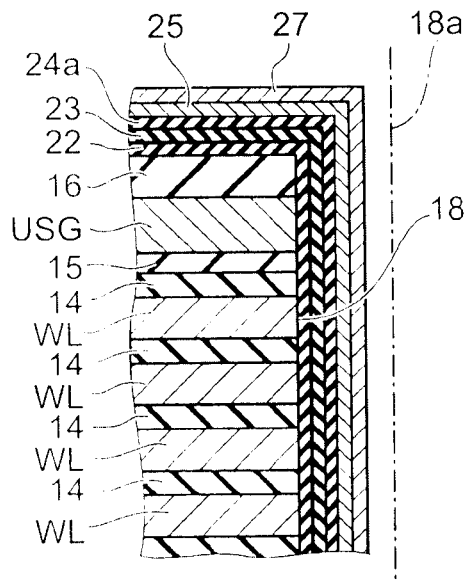
FIGS. 5A to 5D are schematic cross-sectional views of processes, illustrating the formation of the blocking insulating film 22, the charge storage film 23, the tunneling insulating film 24, the semiconductor pillar SP, and the support portion 20.

First, as illustrated in FIG. 5A, a film used to form the blocking insulating layer 22, a film used to form the charge storage layer 23, a film used to form the insulating film 24a, the germanium film 25 that uses germanium, and the aluminum film 27 that uses aluminum are formed in this order from the inner wall of the through-hole 18. For example, the film used to form the blocking insulating film 22 is formed using aluminum oxide; the film used to form the charge storage film 23 is formed using a silicon nitride film; the film used to form the insulating film 24a is formed using a silicon oxide film or an ONO film; the germanium film 25 is formed using germanium; and the aluminum film 27 is formed using aluminum. Known film formation technology such as, for example, CVD (Chemical Vapor Deposition), etc., may be applied to the methods for forming these films.

Figure 5B:
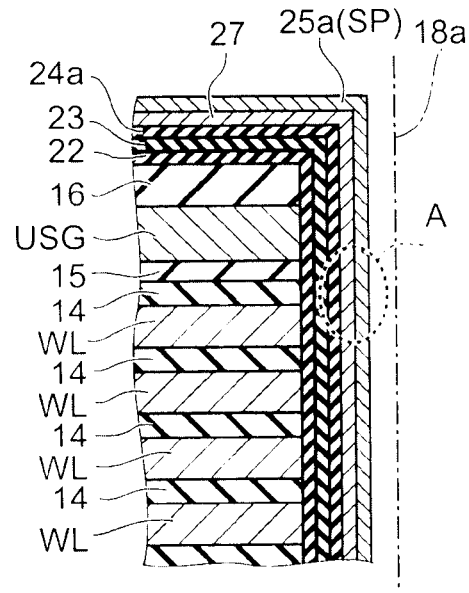

Then, substitution heat treatment is performed as illustrated in FIG. 5B.

Figure 5C:
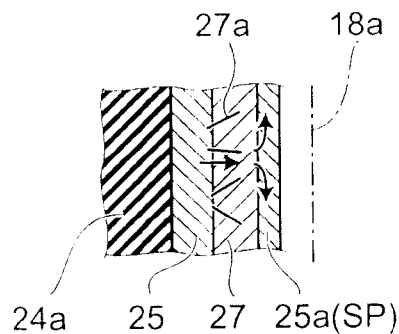

FIG. 5C is an enlarged schematic view of portion A of FIG. 5B and illustrates the substitution heat treatment.

When performing the substitution heat treatment as illustrated in FIG. 5C, the germanium passes through a crystal grain boundary 27a of the aluminum of the aluminum film 27. Then, a germanium film 25a is formed on the side of the aluminum film 27 opposite to the side where the germanium film 25 is provided.

Then, as illustrated in FIG. 5B, the aluminum film 27 is formed on the side of the film used to form the insulating film 24a opposite to the film used to form the charge storage layer 23 while forming the germanium film 25a by causing the germanium to grow on the side of the aluminum film 27 opposite to the film used to form the insulating film 24a. The germanium film 25a becomes the semiconductor pillar SP.

Monocrystallinization can be realized because the germanium can be caused to grow in the axis direction of the through-hole 18 when performing the substitution heat treatment. Therefore, the mobility of the carriers can be increased; the desired threshold can be obtained with few defects; and a semiconductor pillar SP having low fluctuation of the characteristics can be formed.

The substitution heat treatment may be performed by, for example, heating to about 400° C. to 500° C. in an environment without oxygen (e.g., in an inert gas atmosphere and the like).

Figure 5D:
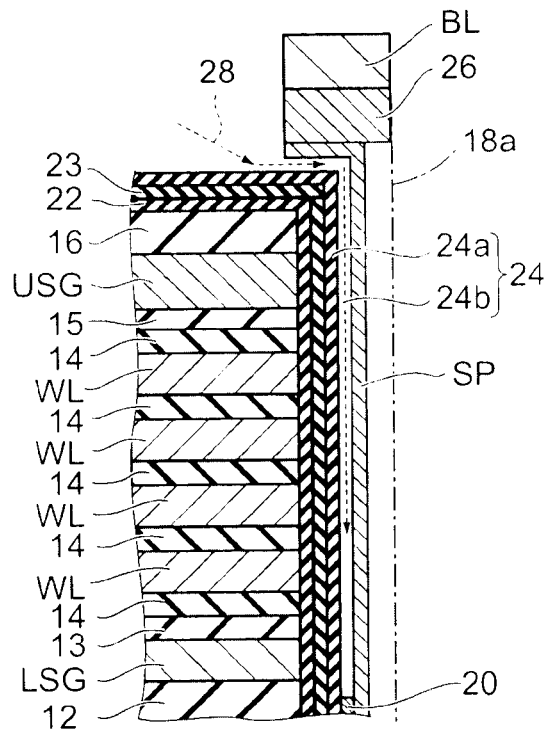

Then, as illustrated in FIG. 5D, the gap 24b is made between the semiconductor pillar SP and the film used to form the insulating film 24a by selectively removing the aluminum film 27. The support portion 20 configured to maintain the distance between the semiconductor pillar SP and the film used to form the insulating film 24a is formed by leaving a portion of the aluminum film 27.

In such a case, the plug conductive layer 26 and the bit line BL may be formed above the upper gate stacked body ML3 prior to selectively removing the aluminum film 27. For example, the films used to form the plug conductive layer 26 and the bit line BL are formed above the upper gate stacked body ML3; and the end portion of the aluminum film 27 is exposed when patterning the bit line BL into the desired configuration. Then, the aluminum film 27 can be selectively removed via the exposed end portion of the aluminum film 27. Thus, the upper end portion of the semiconductor pillar SP can be supported by the bit line BL via the plug conductive layer 26 when selectively removing the aluminum film 27.

The selective removal of the aluminum film 27 may be performed by, for example, wet processing (SH processing) using a mixed liquid 28 of sulfuric acid and aqueous hydrogen peroxide.

For example, the gap 24b may be made by selectively removing the aluminum film 27 by supplying the mixed liquid 28 of sulfuric acid and aqueous hydrogen peroxide via the exposed end portion of the aluminum film 27. Then, the support portion 20 may be formed by leaving a portion of the aluminum film 27 by controlling the duration and the like.

Fourth Embodiment

A method for manufacturing the semiconductor memory device 3 will now be illustrated.

In the description recited below, components similar to the components illustrated in FIG. 3 and FIG. 4 are described using like reference numerals. Therefore, the positional relationships and the like of the components refer to FIG. 3 and FIG. 4.

First, the insulating layer 11a and a back gate electrode BG are formed in the memory region on the substrate 11. Then, recesses for connecting adjacent semiconductor pillars SP are made in the back gate electrode BG by known lithography and RIE; and a sacrificial film is filled into the recesses using amorphous silicon and the like.

Then, the memory stacked body ML2 is formed similarly to that described above.

Continuing, the trenches 54 extending in the stacking direction of the memory stacked body ML2 are made by photolithography and RIE. The trenches 54 are configured to divide the electrode films WL that are adjacent in the Y direction. Then, the insulating film 55 is formed by filling silicon oxide into the trenches 54.

Then, the film used to form the upper selection gate electrodes USG is formed.

Continuing, the through-holes 18 are made to communicate with the recesses by piercing the film used to form the upper selection gate electrodes USG, the insulating film 55, and the memory stacked body ML2 in the stacking direction by photolithography and RIE.

Then, the sacrificial film filled into the recesses is selectively removed via the through-holes 18 by alkaline wet etching and the like.

Continuing, the blocking insulating film 22, the charge storage film 23, the tunneling insulating film 24, the semiconductor pillar SP, and the support portion 20 are formed similarly to those described above.

For example, a film used to form the blocking insulating layer 22, a film used to form the charge storage layer 23, a film used to form the insulating film 24a, the germanium film 25 that uses germanium, and the aluminum film 27 that uses aluminum are formed in this order from the inner wall of the through-hole 18. Then, the semiconductor pillar SP can be formed by performing substitution heat treatment.

A film used to form the plug conductive layer 26, a film used to form the bit line BL, and a film used to form the source line SL are formed on the aluminum film 27; and the end portion of the aluminum film 27 is exposed when patterning these films into the desired configurations. Then, for example, the gap 24b is made by selectively removing the aluminum film 27 via the exposed end portion of the aluminum film 27 by wet processing (SH processing) using the mixed liquid 28 of sulfuric acid and aqueous hydrogen peroxide. The support portion 20 is formed by leaving a portion of the aluminum film 27 by controlling the duration and the like.

Fifth Embodiment

Another embodiment of the memory strings portion provided in the semiconductor memory device 1 illustrated in FIG. 1 will now be illustrated.

Figure 6:
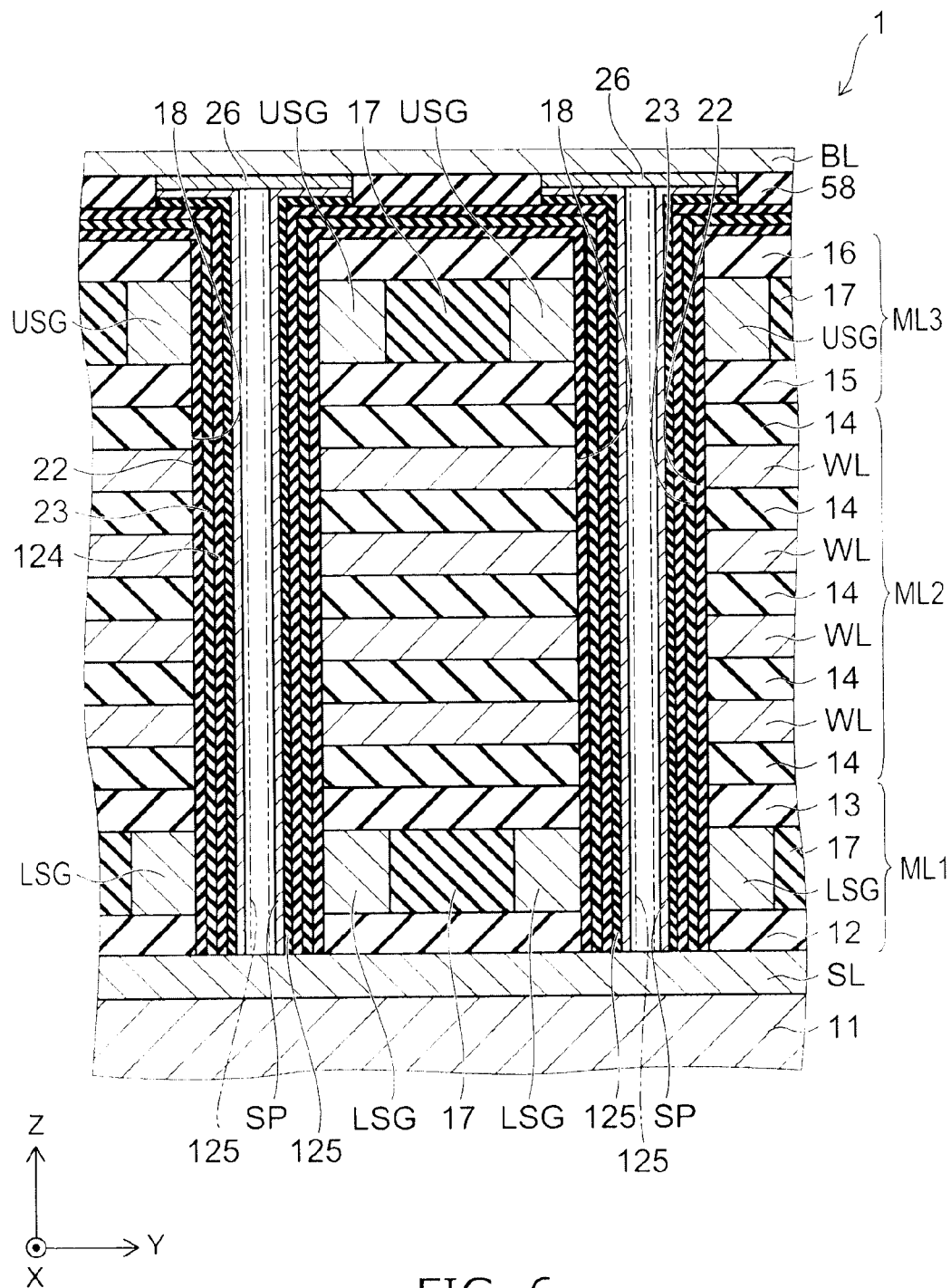
FIG. 6 is a schematic cross-sectional view illustrating a memory strings portion according to this embodiment.

FIG. 6 is a schematic cross-sectional view illustrating a memory strings portion according to this embodiment.

In the embodiment illustrated in FIG. 6, the semiconductor pillar SP is formed using a semiconductor material including germanium. For example, simple germanium, silicon germanium, and the like are examples of the semiconductor material including germanium. An additive portion 125 formed using aluminum oxide is provided on the side surface of the semiconductor pillar SP; and the aluminum is added to the interior of the semiconductor pillar SP. If the aluminum can be added to the semiconductor material including the germanium, restoration of the defects caused by the germanium can be realized. Therefore, the mobility of the carriers can be increased; the desired threshold can be obtained with few defects; and a semiconductor pillar SP having low fluctuation of the characteristics can be formed. Details relating to the disposition of the additive portion 125 and the addition of the aluminum to the interior of the semiconductor pillar SP are described below.

The blocking insulating film 22, the charge storage film 23, and a tunneling insulating film 124 are stacked in this order on the inner surface of the through-hole 18.

Although the tunneling insulating film 124 normally is insulative, the tunneling insulating film 124 may be a film that allows a tunneling current to flow when a prescribed voltage within the range of the drive voltage of the semiconductor memory device 1 is applied. The tunneling insulating film 124 may be formed using, for example, a single-layer silicon oxide film, an ONO film (oxide-nitride-oxide), and the like.

The blocking insulating film 22, the charge storage film 23, and the tunneling insulating film 124 are provided also between the semiconductor pillar SP and the upper selection gate electrode USG to form an upper gate insulating film. Thereby, in the upper gate stacked body ML3, an upper selection transistor is formed in which the semiconductor pillar SP is a body region having a channel region, the upper gate insulating film is a gate insulating film, and the upper selection gate electrode USG is a gate electrode.

The blocking insulating film 22, the charge storage film 23, and the tunneling insulating film 124 are provided also between the semiconductor pillar SP and the lower selection gate electrode LSG to form a lower gate insulating film. Thereby, in the lower gate stacked body ML1, a lower selection transistor is formed in which the semiconductor pillar SP is a body region having a channel region, the lower gate insulating film is a gate insulating film, and the lower selection gate electrode LSG is a gate electrode.

In this embodiment, the additive portion 125 formed using aluminum oxide is provided between the tunneling insulating film 124 and the semiconductor pillar SP. Aluminum is included in the semiconductor pillar SP. The aluminum included in the semiconductor pillar SP is added from the additive portion 125. If the aluminum is added to the semiconductor material including the germanium, restoration of the defects can be realized because the defects of the germanium can be terminated with the aluminum.

In such a case, when the semiconductor pillar SP has a hollow configuration as illustrated in FIG. 3, the additive portion 125 also may be formed on the inner surface of the semiconductor pillar SP; and the additive portion 125 may be formed on the inner surface and the outer surface of the semiconductor pillar SP. In other words, the additive portion 125 may be formed on at least one selected from the inner surface and the outer surface of the semiconductor pillar SP. Although the additive portion 125 may have a film-like configuration, the additive portion 125 may be formed by, for example, filling the interior of the semiconductor pillar SP. It is not always necessary for the additive portion 125 to be continuously formed; and the additive portion 125 may be discontinuous as long as the distribution of the aluminum added to the semiconductor pillar SP is not greatly biased. It is not always necessary for the additive portion 125 to be formed over the entire region of the semiconductor pillar SP; and it is sufficient for the additive portion 125 to be formed in a range such that the aluminum can be added to at least the portions that function as the channels.

According to this embodiment, the semiconductor pillar SP is formed using a semiconductor material including germanium. The additive portion 125 is formed using aluminum oxide; and the aluminum is added to the interior of the semiconductor pillar SP. Therefore, the semiconductor memory device 1 can be provided to increase the mobility of the carriers, obtain the desired threshold with few defects, and suppress the fluctuation of the characteristics.

Sixth Embodiment

Another embodiment of the memory strings portion provided in the semiconductor memory device 3 illustrated in FIG. 3 will now be illustrated.

Figure 7:
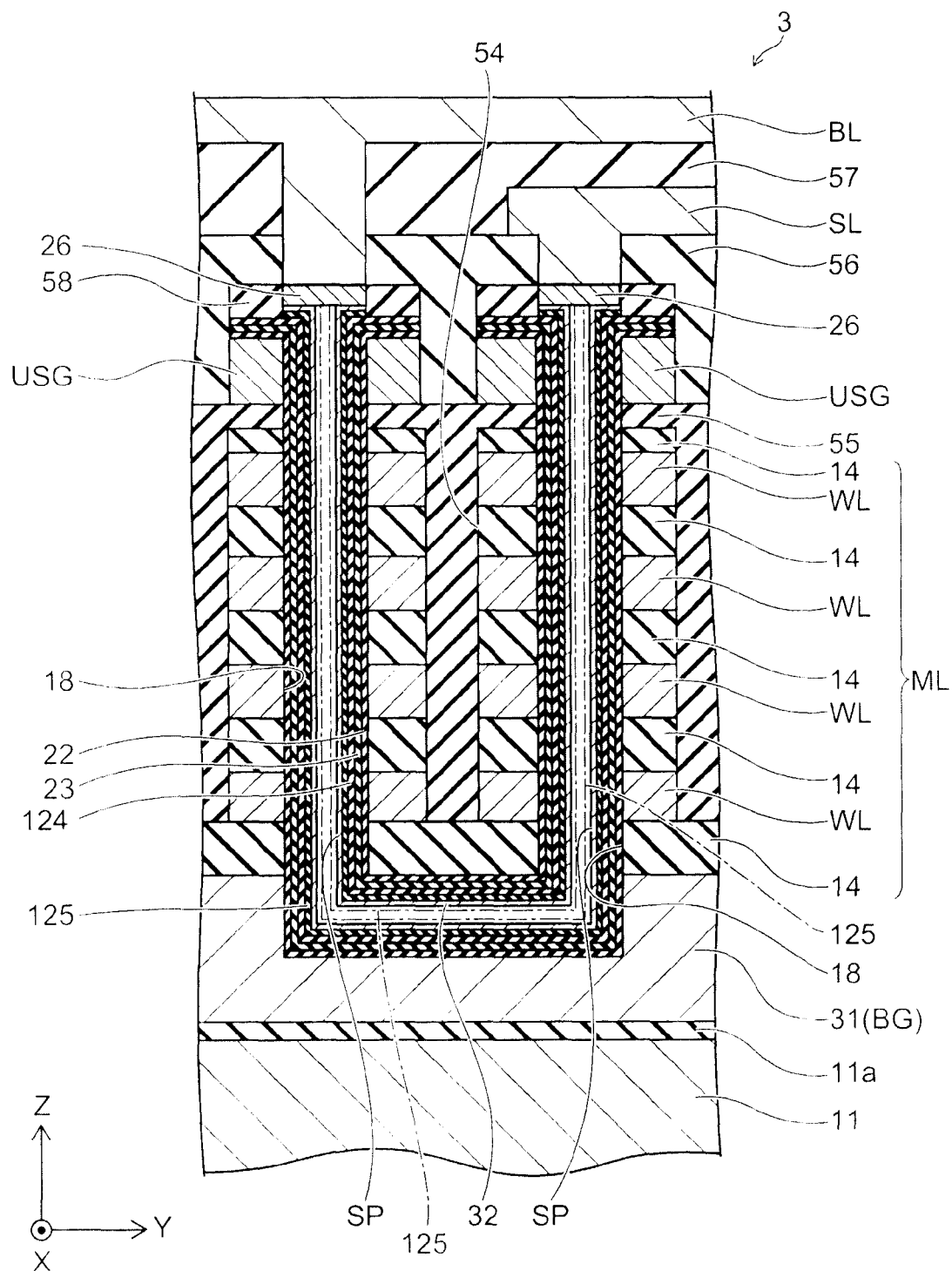
FIG. 7 is a schematic cross-sectional view illustrating the memory strings portion according to this embodiment.

FIG. 7 is a schematic cross-sectional view illustrating the memory strings portion according to this embodiment.

In the embodiment illustrated in FIG. 7 as well, the additive portion 125 formed using aluminum oxide is provided between the tunneling insulating film 124 and the semiconductor pillar SP. Aluminum is included in the semiconductor pillar SP. The aluminum included in the semiconductor pillar SP is added from the additive portion 125. If the aluminum is added to the semiconductor material including the germanium, restoration of the defects can be realized because the defects of the germanium can be terminated with the aluminum.

In such a case, similarly to the description recited above, when the semiconductor pillar SP has a hollow configuration, the additive portion 125 may be formed on the inner surface of the semiconductor pillar SP; and the additive portion 125 may be formed on the inner surface and the outer surface of the semiconductor pillar SP. In other words, the additive portion 125 may be formed on at least one selected from the inner surface and the outer surface of the semiconductor pillar SP. The additive portion 125 may have a film-like configuration or may be formed by, for example, filling the interior of the semiconductor pillar SP. It is not always necessary for the additive portion 125 to be continuously formed; and the additive portion 125 may be discontinuous as long as the distribution of the aluminum added to the semiconductor pillar SP is not greatly biased. It is not always necessary for the additive portion 125 to be formed over the entire region of the semiconductor pillar SP; and it is sufficient for the additive portion 125 to be formed in a range such that the aluminum can be added to at least the portions that function as the channels.

According to this embodiment, the semiconductor pillar SP is formed using a semiconductor material including germanium. The additive portion 125 is formed using aluminum oxide; and the aluminum is added to the interior of the semiconductor pillar SP. Therefore, the semiconductor memory device 3 can be provided to increase the mobility of the carriers, obtain the desired threshold with few defects, and suppress the fluctuation of the characteristics.

Seventh Embodiment

A method for manufacturing the semiconductor memory device 1 including the memory strings portion illustrated in FIG. 6 will now be illustrated.

In the description recited below, components similar to the components illustrated in FIG. 1 and FIG. 6 are described using like reference numerals. Therefore, the positional relationships and the like of the components refer to FIG. 1 and FIG. 6.

The formation of the source line SL, the lower gate stacked body ML1, the memory stacked body ML2, the upper gate stacked body ML3, and the through-hole 18 may be similar to that illustrated in the third embodiment. Therefore, a description relating to the formation of these components is omitted.

Therefore, the formation processes of the blocking insulating film 22, the charge storage film 23, the tunneling insulating film 124, the semiconductor pillar SP, and the additive portion 125 and subsequent processes will now be illustrated.

Figure 8A:
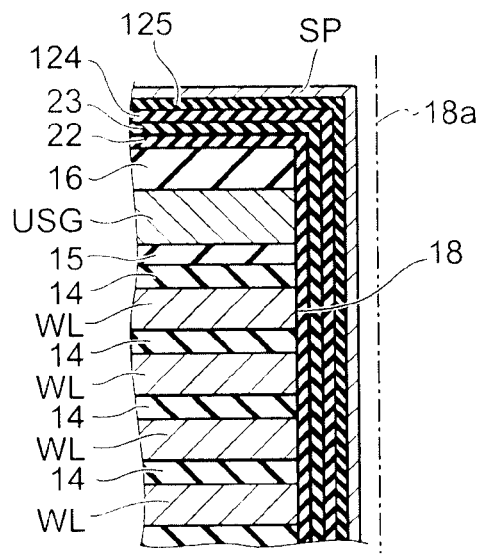
FIGS. 8A to 8C are schematic cross-sectional views of processes, illustrating the formation of the blocking insulating film 22, the charge storage film 23, the tunneling insulating film 124, the semiconductor pillar SP, and the additive portion 125.
Figure 8B:
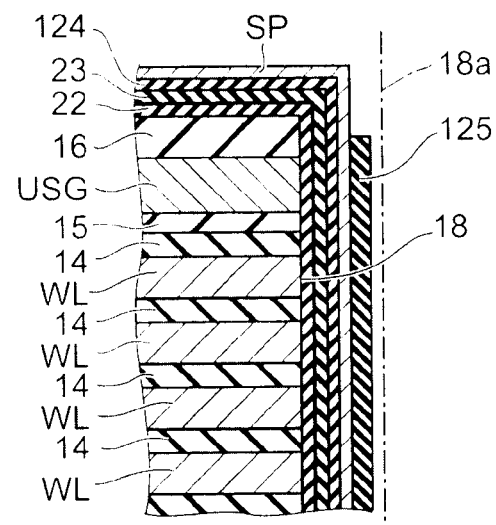
Figure 8C:
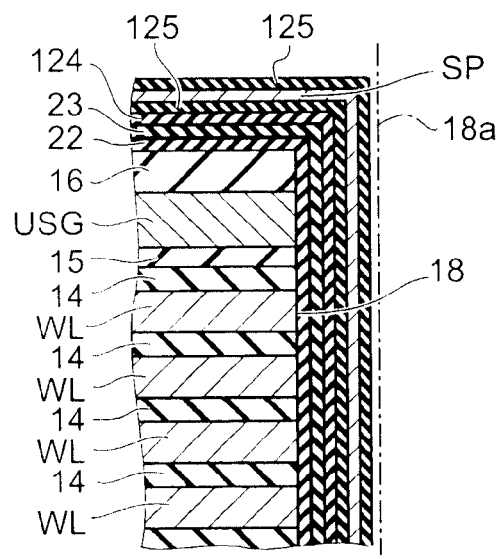

FIGS. 8A to 8C are schematic cross-sectional views of processes, illustrating the formation of the blocking insulating film 22, the charge storage film 23, the tunneling insulating film 124, the semiconductor pillar SP, and the additive portion 125.

To avoid complexity in FIGS. 8A to 8C, only one side from the center line 18a of the through-hole 18 is illustrated.

As illustrated in FIG. 8A, the additive portion 125 may be formed on the outer surface of the semiconductor pillar SP.

In such a case, a film used to form the blocking insulating layer 22, a film used to form the charge storage layer 23, a film used to form the tunneling insulating film 124, the additive portion 125, and the semiconductor pillar SP are formed in this order from the inner wall of the through-hole 18.

For example, the film used to form the blocking insulating film 22 may be formed using aluminum oxide; the film used to form the charge storage film 23 may be formed using a silicon nitride film; the film used to form the tunneling insulating film 124 may be formed using a silicon oxide film or an ONO film; the additive portion 125 may be formed using aluminum oxide; and the semiconductor pillar SP may be formed using a semiconductor material including germanium such as germanium, silicon germanium, etc. Known film formation technology such as, for example, CVD, etc., may be applied to the formation methods of these components.

As illustrated in FIG. 8B, the additive portion 125 may be formed on the inner surface of the semiconductor pillar SP.

In such a case, the film used to form the blocking insulating layer 22, the film used to form the charge storage layer 23, the film used to form the tunneling insulating film 124, the semiconductor pillar SP, and the additive portion 125 are formed in this order from the inner wall of the through-hole 18. The formation of these components may be similar to that illustrated in FIG. 8A.

It is not always necessary to form the additive portion 125 over the entire region of the semiconductor pillar SP. It is sufficient for the additive portion 125 to be formed in a range such that the aluminum can be added to at least the portions that function as the channels. For example, as illustrated in FIG. 8B, the additive portion 125 may be formed in a region lower than the portion opposing the upper selection gate electrode USG.

As illustrated in FIG. 8C, the additive portion 125 may be formed on the outer surface and the inner surface of the semiconductor pillar SP.

In such a case, the film used to form the blocking insulating layer 22, the film used to form the charge storage layer 23, the film used to form the tunneling insulating film 124, the additive portion 125, the semiconductor pillar SP, and the additive portion 125 are formed in this order from the inner wall of the through-hole 18. The formation of these components may be similar to that illustrated in FIG. 8A.

Then, the aluminum is added to the interior of the semiconductor pillar SP from the additive portion 125 and caused to diffuse. As illustrated in FIGS. 8A and 8B, for example, the additive portion 125 may be formed on the side surface of the semiconductor pillar SP using aluminum oxide; and the aluminum may be added to the interior of the semiconductor pillar SP from the additive portion 125 and caused to diffuse by heating. If the aluminum is added to the semiconductor material including the germanium, restoration of the defects can be realized because the defects of the germanium can be terminated with the aluminum.

Figure 9A:
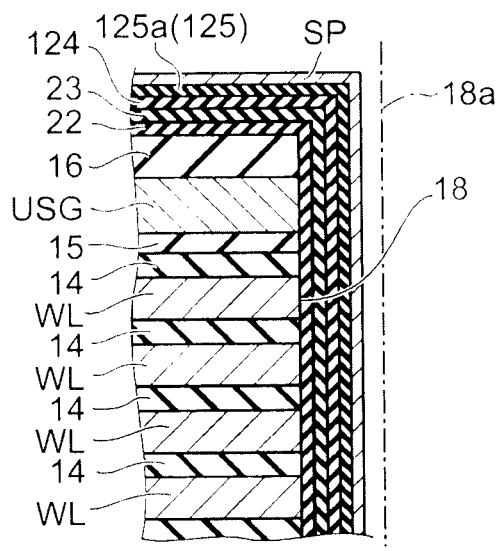
FIGS. 9A to 9C are schematic cross-sectional views of processes, illustrating the formation of the blocking insulating film 22, the charge storage film 23, the tunneling insulating film 124, the semiconductor pillar SP, and the additive portion 125 according to another embodiment.
Figure 9B:
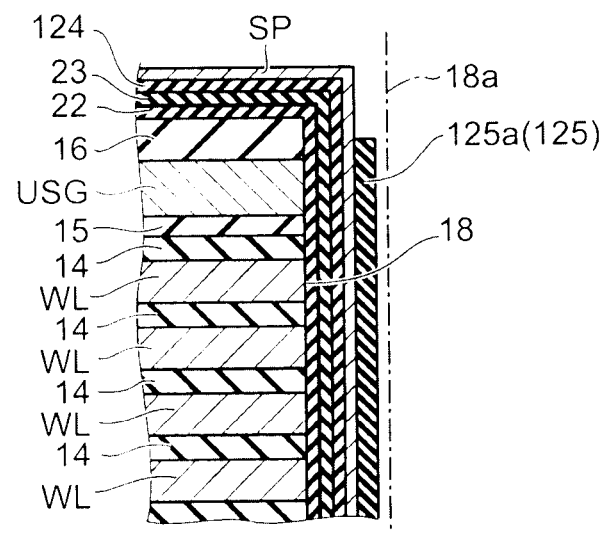
Figure 9C:
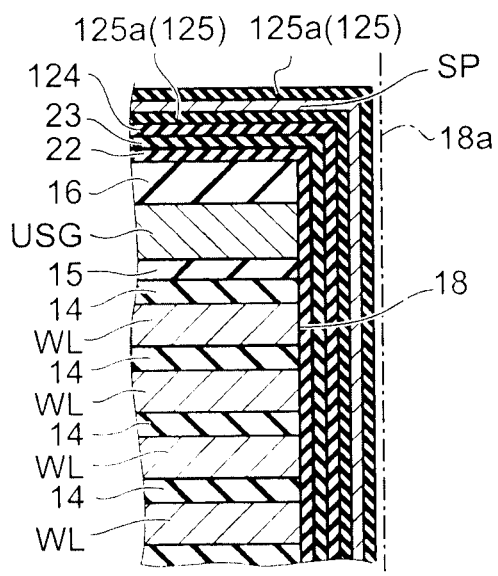

FIGS. 9A to 9C are schematic cross-sectional views of processes, illustrating the formation of the blocking insulating film 22, the charge storage film 23, the tunneling insulating film 124, the semiconductor pillar SP, and the additive portion 125 according to another embodiment.

To avoid complexity in FIGS. 9A to 9C, only one side from the center line 18a of the through-hole 18 is illustrated.

The processes illustrated in FIGS. 8A to 8C illustrate the case where the additive portion 125 is formed on the side surface of the semiconductor pillar SP using aluminum oxide, and the aluminum is added to the interior of the semiconductor pillar SP and caused to diffuse by heating.

Conversely, the processes illustrated in FIGS. 9A to 9C illustrate the case where an additive film (a first aluminum film) 125a is formed on the side surface of the semiconductor pillar SP using aluminum, and the additive film 125a is heated in an oxygen gas atmosphere to add the aluminum to the interior of the semiconductor pillar SP while forming the additive portion 125 of aluminum oxide by causing the additive film 125a of aluminum to oxidize.

As illustrated in FIG. 9A, for example, the additive film 125a used to form the additive portion 125 may be formed on the outer surface of the semiconductor pillar SP. In such a case, the additive film 125a may be formed using aluminum; and the formation method may include replacing the additive portion 125 of the case illustrated in FIG. 8A with the additive film 125a.

As illustrated in FIG. 9B, the additive film 125a used to form the additive portion 125 may be formed on the outer surface of the semiconductor pillar SP; and as illustrated in FIG. 9C, the additive film 125a used to form the additive portion 125 may be formed on the outer surface and the inner surface of the semiconductor pillar SP. In these cases, the method for forming the additive film 125a may include replacing the additive portion 125 of the case illustrated in FIG. 8B and FIG. 8C with the additive film 125a.

Then, the aluminum is added to the interior of the semiconductor pillar SP from the additive film 125a and caused to diffuse while forming the additive portion 125 by causing the additive film 125a to oxidize. As illustrated in FIGS. 9A and 9B, for example, the additive film 125a may be formed on the side surface of the semiconductor pillar SP using aluminum; and heating in an oxygen gas atmosphere may be performed to add the aluminum to the interior of the semiconductor pillar SP from the additive film 125a and cause the aluminum to diffuse while forming the additive portion 125 by causing the additive film 125a to oxidize. If the aluminum is added to the semiconductor material including the germanium, restoration of the defects can be realized because the defects of the germanium can be terminated with the aluminum.

FIGS. 10A to 10D are schematic cross-sectional views of processes, illustrating the formation of the blocking insulating film 22, the charge storage film 23, the tunneling insulating film 124, the semiconductor pillar SP, and the additive portion 125 according to another embodiment.

To avoid complexity in FIGS. 10A to 10D, only one side from the center line 18a of the through-hole 18 is illustrated.

FIGS. 10A to 10D illustrate the case where the additive film 125a is formed on the side surface of the semiconductor pillar SP using aluminum, and the aluminum is added to the germanium and caused to diffuse by performing substitution heat treatment.

In such a case, for example, in the heat treatment process that performs the substitution heat treatment, at least a portion of the aluminum film 125a is caused to diffuse into the semiconductor pillar SP while forming the aluminum film (the second aluminum film) on the inner surface of the semiconductor pillar SP.

Figure 10A:
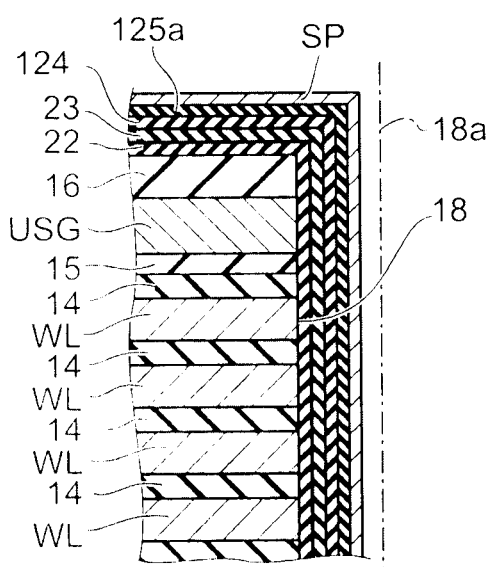
FIGS. 10A to 10D are schematic cross-sectional views of processes, illustrating the formation of the blocking insulating film 22, the charge storage film 23, the tunneling insulating film 124, the semiconductor pillar SP, and the additive portion 125 according to another embodiment.
Figure 10B:
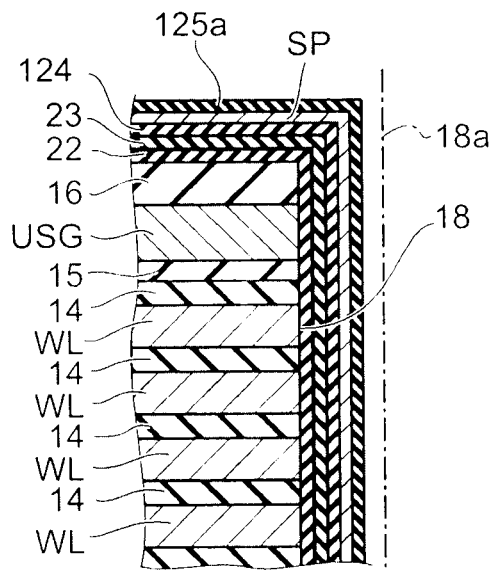

For example, first, as illustrated in FIG. 10A, the additive film 125a used to form the additive portion 125 is formed on the outer surface of the semiconductor pillar SP. In such a case, as illustrated in FIG. 10B, the additive film 125a used to form the additive portion 125 also may be formed on the inner surface of the semiconductor pillar SP.

Then, substitution heat treatment is performed.

Figure 10C:
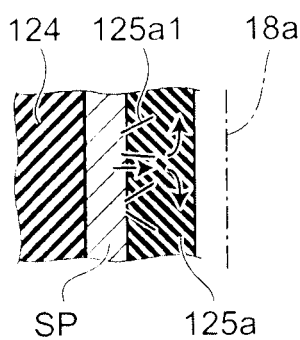

When performing the substitution heat treatment as illustrated in FIG. 10C, the germanium passes through a crystal grain boundary 125a1 of the aluminum of the additive film 125a formed using aluminum. Then, the semiconductor pillar SP is re-formed by the germanium growing in the axis direction of the through-hole 18 after passing through the crystal grain boundary 125a1 of the aluminum. In such a case, the occurrence of the defects can be suppressed because the monocrystallinization of the germanium can be realized. When performing the substitution heat treatment, the aluminum may be added to the interior of the semiconductor pillar SP from the additive film 125a and caused to diffuse. Therefore, restoration of the defects can be realized even in the case where the defects occur because the defects of the germanium can be terminated with the aluminum.

The substitution heat treatment may be performed by, for example, heating to about 400° C. to 500° C. in an environment without oxygen (e.g., in an inert gas atmosphere and the like).

Figure 10D:
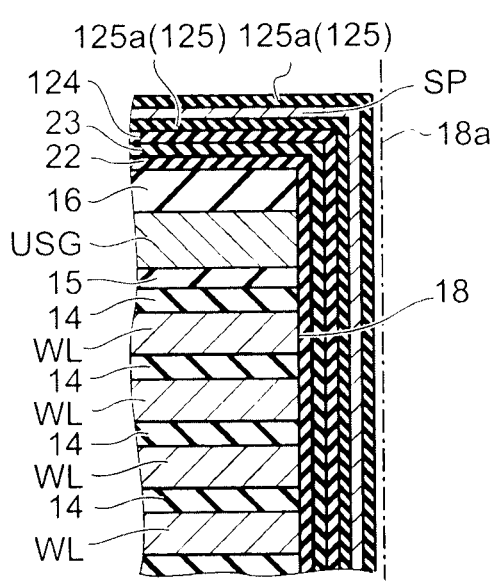

In the substitution heat treatment, the relative positions of the additive film 125a and the re-formed semiconductor pillar SP can be controlled by controlling the duration and the like. For example, as illustrated in FIG. 10D, the semiconductor pillar SP may be re-formed inside the additive films 125a.

Then, the additive portion 125 is formed by causing the additive film 125a to oxidize. For example, the additive portion 125 may be formed by causing the additive film 125a to oxidize by heating in an oxygen gas atmosphere. In such a case, the aluminum also may be added to the interior of the semiconductor pillar SP from the additive film 125a and caused to diffuse.

Subsequently, the plug conductive layer 26, the bit line BL, and the like are formed above the upper gate stacked body ML3. For example, the films used to form the plug conductive layer 26 and the bit line BL may be formed above the upper gate stacked body ML3; and the bit line BL, the plug conductive layer 26, and the like may be patterned into the desired configurations by photolithography and RIE.

Eighth Embodiment

A method for manufacturing the semiconductor memory device 3 including the memory strings portion illustrated in FIG. 7 will now be illustrated.

In the description recited below, components similar to the components illustrated in FIG. 3 and FIG. 7 are described using like reference numerals. Therefore, the positional relationships and the like of the components refer to FIG. 3 and FIG. 7

The formation of the insulating layer 11a, the back gate electrode BG, the memory stacked body ML2, the upper selection gate electrode USG, the through-hole 18, the bit line BL, the source line SL, the plug conductive layer 26, and the like may be similar to that illustrated in the fourth embodiment. Therefore, a description relating to the formation of these components is omitted.

The formation of the blocking insulating film 22, the charge storage film 23, the tunneling insulating film 124, the semiconductor pillar SP, and the additive portion 125 may be similar to that illustrated in FIG. 8A to FIG. 10D.

In such a case, the additive portion 125 is formed on the side surface of the semiconductor pillar SP using aluminum oxide; and the aluminum is added to the interior of the semiconductor pillar SP and caused to diffuse by performing heat treatment of the additive portion 125.

The additive film 125a may be formed on the side surface of the semiconductor pillar SP using aluminum; and the additive film 125a may be heated in an oxygen gas atmosphere to add the aluminum to the interior of the semiconductor pillar SP and cause the aluminum to diffuse while forming the additive portion 125 by causing the additive film 125a to oxidize.

The additive film 125a may be formed on the side surface of the semiconductor pillar SP using aluminum; and substitution heat treatment may be performed to re-form the semiconductor pillar SP having few defects while adding the aluminum to the interior of the re-formed semiconductor pillar SP and causing the aluminum to diffuse. Then, heating in an oxygen gas atmosphere may be performed to form the additive portion 125 by causing the additive film 125a to oxidize while adding the aluminum to the interior of the semiconductor pillar SP from the additive film 125a and causing the aluminum to diffuse.

According to the embodiment illustrated above, a semiconductor memory device and a method for manufacturing the semiconductor memory device can be realized to increase the read-out speed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions. Moreover, above-mentioned embodiments can be combined mutually and can be carried out.

What is claimed is:

1. A semiconductor memory device, comprising:
a stacked body including a plurality of electrode films stacked with an inter-layer insulating film provided between the electrode films;
a semiconductor pillar piercing the stacked body;
an insulating film provided between the semiconductor pillar and the electrode films on an outer side of the semiconductor pillar with a gap interposed;
a charge storage film provided between the insulating film and the electrode films; and
a support portion provided on a lower end side of the semiconductor pillar and configured to maintain a distance between the insulating film and the semiconductor pillar,
the semiconductor pillar including germanium,
an upper end portion of the semiconductor pillar being supported by an interconnect provided above the stacked body, and
the support portion including aluminum.

2. The device according to claim 1, wherein an upper end of the support portion is lower than a lower end of the electrode film of a lowermost layer.

3. The device according to claim 1, wherein the insulating film and the gap are used as a tunneling insulating film.

4. The device according to claim 1, comprising a blocking insulating film including aluminum oxide provided between the charge storage film and the electrode films.

5. The device according to claim 1, wherein:
the semiconductor pillar is multiply provided; and
the device comprises a connection member connecting lower end portions of mutually-adjacent semiconductor pillars.

* * * * *